United States Patent
Adkisson et al.

(10) Patent No.: US 6,197,656 B1
(45) Date of Patent: *Mar. 6, 2001

(54) METHOD OF FORMING PLANAR ISOLATION AND SUBSTRATE CONTACTS IN SIMOX-SOI.

(75) Inventors: James W. Adkisson, Jericho; Jerome B. Lasky; Paul W. Pastel, both of Essex Junction; Jed H. Rankin, Burlington, all of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/047,029

(22) Filed: Mar. 24, 1998

(51) Int. Cl.$^7$ .................................................. H01L 21/762
(52) U.S. Cl. ............................................................. 438/423
(58) Field of Search ................... 438/407, 423, 438/440, FOR 158, FOR 222

(56) References Cited

U.S. PATENT DOCUMENTS

| | | |
|---|---|---|
| 3,707,765 | * 1/1973 | Coleman . |
| 3,897,274 | * 7/1975 | Stehlin et al. . |
| 4,754,314 | 6/1988 | Scott et al. . |
| 4,789,642 | * 12/1988 | Lorenzo et al. . |
| 4,874,718 | 10/1989 | Inoue . |
| 5,121,185 | 6/1992 | Tamba et al. . |
| 5,172,203 | 12/1992 | Hayashi . |
| 5,229,316 | 7/1993 | Lee et al. . |
| 5,346,841 | * 9/1994 | Yajima et al. . |
| 5,364,800 | * 11/1994 | Joyner . |
| 5,389,563 | 2/1995 | Kuroi et al. . |
| 5,536,675 | 7/1996 | Bohr . |
| 5,597,738 | 1/1997 | Kurtz et al. . |
| 5,608,252 | 3/1997 | Nakato . |

FOREIGN PATENT DOCUMENTS

| | | |
|---|---|---|
| 51-53488 | 5/1976 | (JP) . |
| 57-45947 | 3/1982 | (JP) . |
| 63-2350 | 1/1988 | (JP) . |
| 4-196478 | 7/1992 | (JP) . |
| 5-175470 | 7/1993 | (JP) . |
| 6-140427 | 5/1994 | (JP) . |
| 7-94439 | 4/1995 | (JP) . |

OTHER PUBLICATIONS

Davis, J.R., et al, "Dielectrically Isolated . . . Masked Oxygen Ion Implantation", Appl. Phys. Lett. vol. 51, No. 18, pp. 419–421 Nov. 2, 1987.*

* cited by examiner

Primary Examiner—George Fourson
(74) Attorney, Agent, or Firm—McGuireWood, LLP; Eugene I. Shkurko

(57) ABSTRACT

Oxygen implantation can be used to form a buried oxide layer in a substrate. A dielectric masking material is used to shape the buried oxide layer by changing the depth at which ions can implant based on the shape of the dielectric masking layer.

30 Claims, 6 Drawing Sheets

METHOD OF FORMING PLANAR ISOLATION AND SUBSTRATE CONTACTS IN SIMOX-SOI.

DESCRIPTION

BACKGROUND OF THE INVENTION

1. Field of the Invention

The present invention generally relates to semiconductor chip manufacture and more particularly to formation of lateral and vertical isolation structures.

2. Background Description SIMOX (Separation by IMplantation of OXygen) uses a high-dose oxygen implant to form a buried $SiO_2$ layer. As described by Leray et al. ("An Overview of Buried Oxides on Silicon: New Processes and Radiation Effects", *J. Phys. III France* 6 (1996) 1625–1646.), an insulating layer is obtained underneath the silicon surface by implantation of oxygen ions in a silicon wafer. The energy of the oxygen ions directly determines the range and profile of the implanted layer. Ion energy and oxygen fluence determine the thickness of buried oxide and top silicon layer over buried oxide.

SUMMARY OF THE INVENTION

It is therefore an object of the present invention to provide an improved method for formation of planar isolation between devices.

The present invention is a method of forming a buried oxide layer wherein a masking layer, preferably a hard dielectricable to withstand the high temperature implantation and to resist the cleans during implantation, is applied and masked. Various thicknesses in the dielectric can be fabricated (e.g., by deposition followed by masked etching) to achieve various depths of the buried oxide layer, including oxide layers in contact with the surface, and no oxide layers at all. Optionally, to relieve stress and provide a continuous oxide film, an angled mask may be formed. However, sputtering during oxygen implantation may form an angle without additional processing. Optional annealing to round mask corners may form defects during the annealing step. Minimum buried oxide dimensions are determined by stress and lithography requirements and are independent of latchup or fill requirements. Buried devices may be formed beneath the buried oxide layer by deep dopant implantation after the buried oxide layer. Examples of such buried devices are buried resistors for improved power dissipation, lateral bipolar transistors, etc. In addition, fully isolated devices may be placed in regions where no buried oxide is formed (i.e., in substrate contact regions) allowing bulk devices to be fabricated simultaneously where required for improved thermal conductivity or to avoid the floating body effect of silicon on insulator (SOI) devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
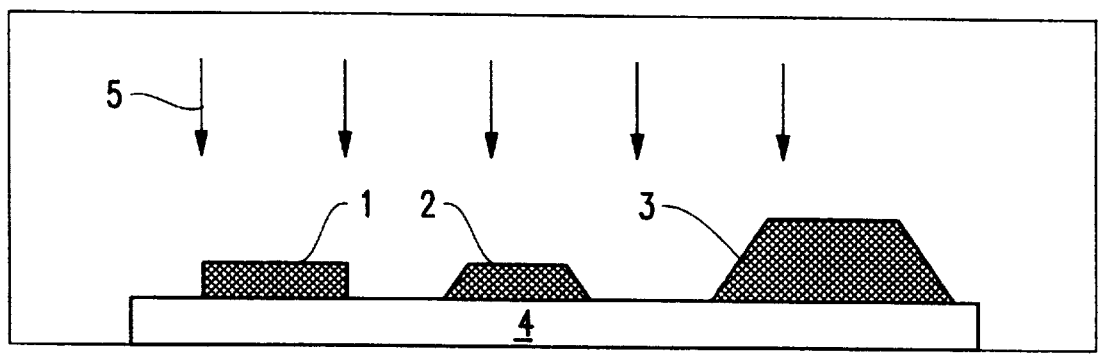
FIG. 1 is a cross section of silicon substrate with mask.

Referring now to the drawings, and more particularly to FIG. 1, there is shown a cross section of a dielectric mask 1, 2, 3 on a silicon substrate 4. Note that section 3 of the mask is thicker than sections 1 and 2. Arrows 5 represent oxygen being implanted in the substrate 4.

Buried oxide formation from oxygen implantation is dependent on both the amount of oxygen to be implanted and the thickness of the mask used. The oxygen implanted will penetrate to a roughly uniform depth from the surface upon which ions strike. So, ions hitting unmasked portions of the surface will be implanted deeper than ions which travel through a mask shapes 1, 2 or 3. If the mask is thicker than the range of travel of the oxygen ions, the ions hitting the surface of the thicker mask shapes will only travel through the mask material and not enter the substrate below the thicker mask shapes.

Figure 2:
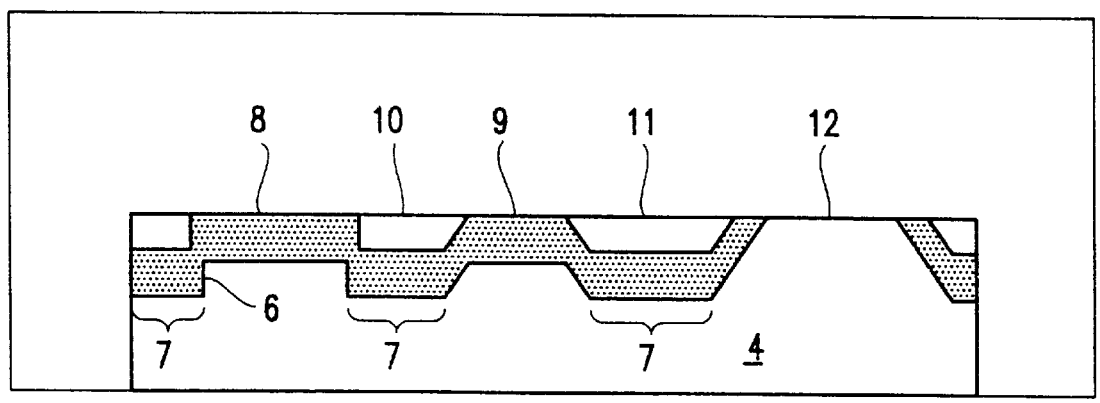
FIG. 2 is a cross section the same silicon substrate shown in FIG. 1 following oxygen implantation.

Thus, as can be seen in FIG. 2, which shows a cross section of the same silicon substrate 4 after oxygen implantation and mask removal, implantation results in a buried oxygen layer 6 with a varying depth in the silicon substrate 4. The buried oxygen layer 6 is deeper in formerly uncovered sections 7, which were between the mask shapes 1, 2 and 3. Further, thick mask shape 3 blocked implantation such that no buried oxygen layer 6 was formed in area 12, providing a substrate contact area there. Isolation regions 8 and 9 formed where oxygen layer 6 surfaces on the silicon substrate 4. Isolation regions 8 and 9 isolate active areas 10 and 11 where the buried oxygen layer 6 is below the surface of the silicon substrate 4.

Figure 3:
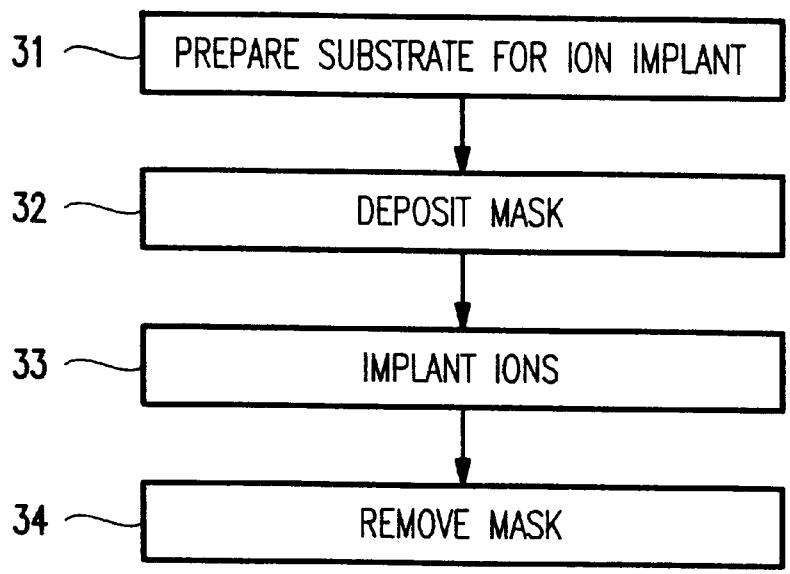
FIG. 3 is a flow chart of the steps of the preferred embodiment method.
Figure 4:
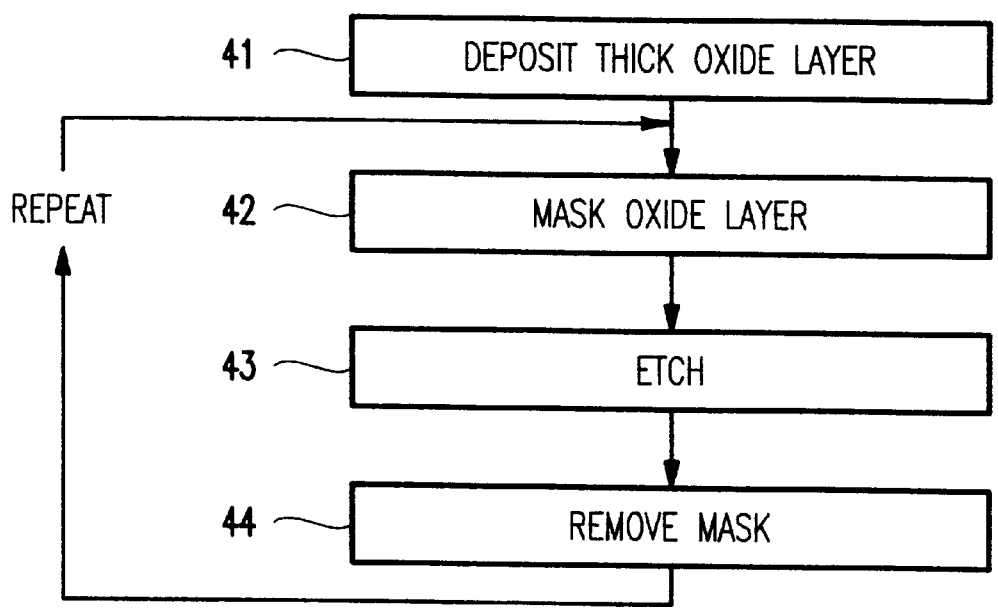
FIG. 4 is a flow chart of the steps of a first embodiment method of mask formation.

FIG. 3 shows of a flow chart of the steps of the preferred method of the present invention. First, in step 31, the silicon wafer or substrate 4 is prepared for ion implantation. Preparation of the substrate includes cleaning the silicon wafers using standard cleaning techniques to remove contaminants. Then, in step 32, a dielectric mask is formed on the cleaned wafer 4. The mask deposition 32 is discussed in further detail with reference to FIGS. 4, 5, and 6. Next, in step 33, oxygen ions are implanted using commercially available high-current implantation equipment.

Finally, in step 34, the mask is removed using standard, selective etch techniques. Thus, for the oxide mask, a simple wet etch with a hydrofluoric acid solution will remove the mask selective to the underlying silicon. For more complicated Polysilicon/Nitride on oxide composite masks, both the polysilicon and nitride may be removed, selectively, using dry and wet etch techniques familiar to those practiced in the art. After removing the mask in step 34 surface and buried devices may be formed on the substrate 4 with its patterned buried oxide layer 6.

The dielectric implant mask can be formed in step 32 in many ways. A first method of mask formation is shown in the flow chart of FIG. 4. First, in step 41, a thick oxide layer is formed. Then, the oxide layer is masked in step 42 using a photolithographically defined resist mask and etched in step 43. The mask is then removed in step 44 and to selectively thin mask shapes, a new mask is applied in step 42. These steps 42, 43 may be repeated several times until the various desired mask shape thicknesses are reached. The mask used is defined in step 42 using standard photolithographic processing techniques and layers etched in step 43 using standard selective etching techniques such as, for example a wet, dry or chemical downstream etching technique.

Figure 5:
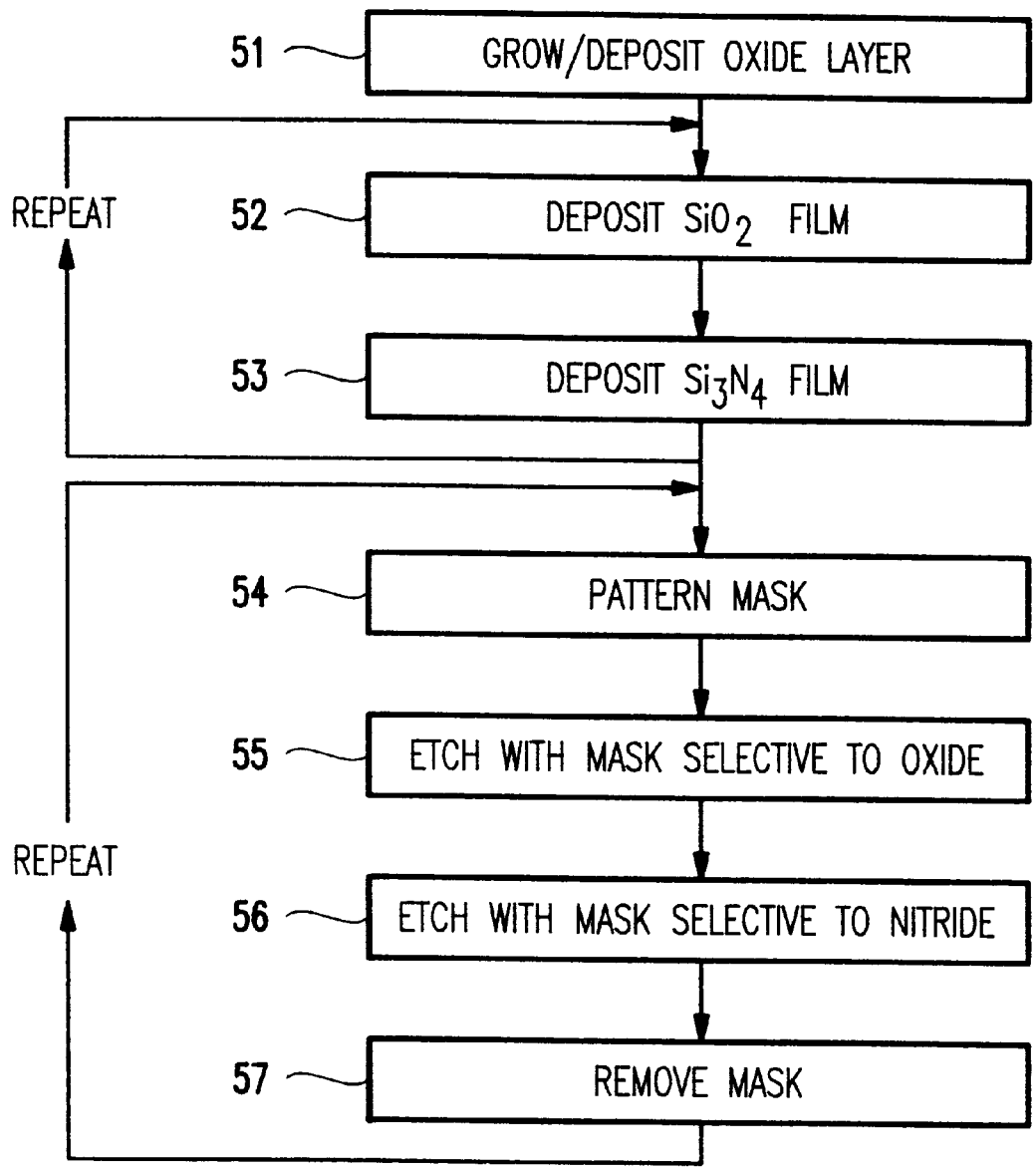
FIG. 5 is a flow chart of the steps of a second embodiment method of mask formation.

The flow chart of FIG. 5 is a second method of forming the mask of step 32. First, in step 51 an $SiO_2$ film is grown or deposited on the substrate 4. Then, in step 52, a thin nitride film is deposited on the $SiO_2$ film. In step 53, another oxide film is deposited on the nitride film. The steps 52 and 53 of depositing oxide and nitride films are repeated until the layered masking layer is the desired mask thickness, as determined by the minimum final desired implantation depth. Then, in step 54, a mask is formed on the layered masking layer. In step 55, the surface oxide film layer is masked and etched, selective to nitride. Next in step 56, nitride is etched selective to the silicon and oxide. In step 57, the mask is removed and in step 54 a new mask is formed. The masking in step 54 and etching of layered masking layers in steps 55 and 56 is repeated until the desired shape topography of the dielectric mask is complete. When the final layer is reached, the surface oxide formed in step 51 is removed selectively to the layers above it and the silicon surface.

Figure 6:
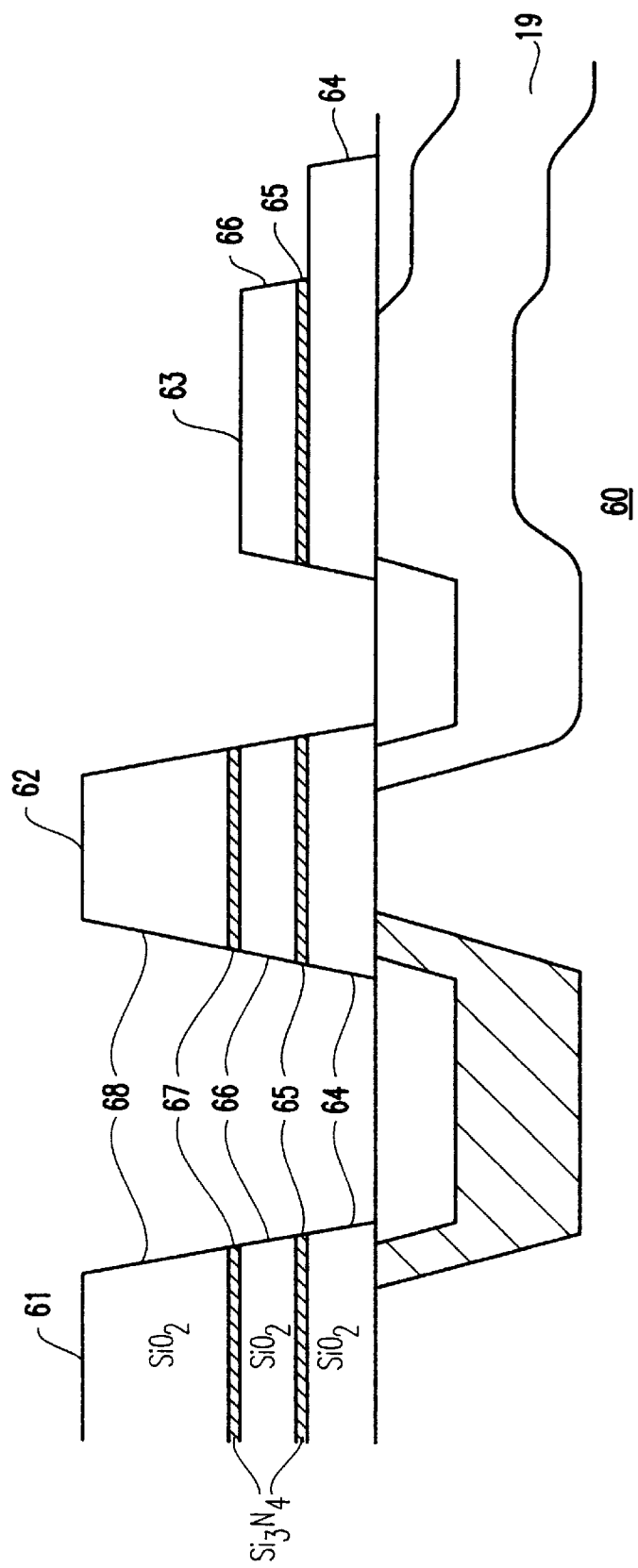
FIG. 6 is a cross section of silicon substrate with a preferred embodiment mask.
Figure 7:
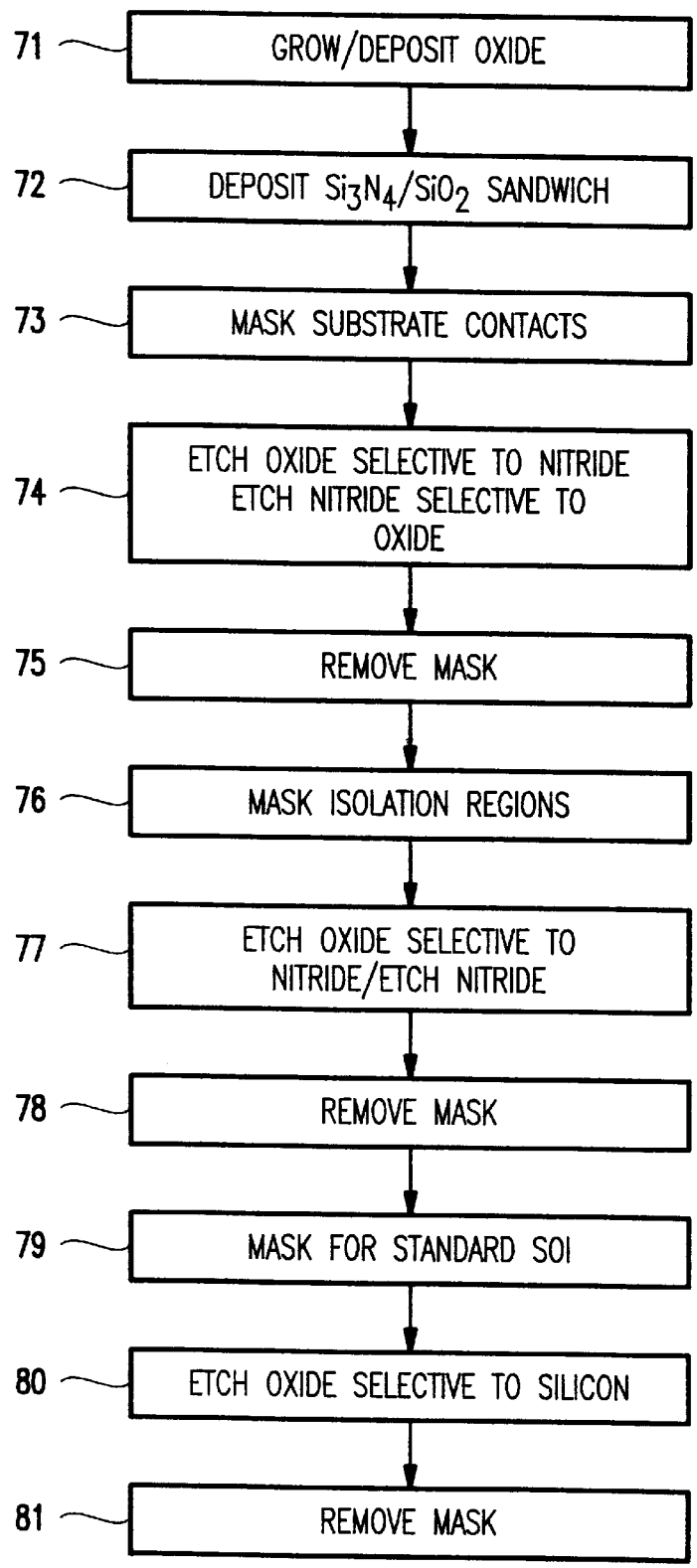
FIG. 7 is a flow chart of the steps of a preferred embodiment method of mask formation.

FIG. 6 is the preferred structure formed using the mask formation step 32 of the flow chart of FIG. 7. For the preferred structure, mask shapes 61, 62 and 63 are formed on a substrate 60 from an oxide/nitride layered stack that is approximately 600 nm thick. Preferably, the layered stack includes a 150 nm oxide base layer 64, a 25 nm nitride layer 65 on the base layer 64, a 75 nm oxide layer 66 on nitride layer 65, a 30 nm nitride on oxide layer 67 and, it is capped with a 320 nm oxide layer 68. These thicknesses may be varied based on the desired final mask shape and for a particular application. Further, if denser patterns are desired, then, the mask layers may be scaled vertically to move buried oxide layer 69 closer to the substrate's surface.

Thus, in step 71, the oxide base layer 64 is grown and/or deposited. Then layers 65–68 are deposited on the base layer 64 in step 72. Next, in step 73, a mask is formed for substrate contact shapes 61–62. Then, in step 74, oxide layer 68 is etched selectively to its underlying nitride 67. The exposed nitride is etched selectively to its underlying oxide, exposing portions of oxide layer 66.

In step 75, the substrate contact mask is removed and, in step 76, a second mask is formed for shapes 63 over isolation regions. Then, in step 77, oxide layer 66 is etched selectively to its underlying nitride 65, which is etched selectively to its underlying oxide, exposing portions of base oxide layer 64. Then, in step 78, the mask is removed.

Optionally, in step 79, an additional mask may be formed, protecting regions of where thin regions thin standard silicon on isolation (SOI) is to be formed. In step 80, the base oxide 64 is etched selectively to silicon. Then, in step 81, the optional mask is removed.

This implantation technique may be scaled to smaller dimensions as the vertical dimensions are scaled. The limit of the scaling is the point at which dislocations are generated from a radius of curvature at the buried oxide corners that is too small. These dislocations occur because $SiO_2$ and Si have different thermal expansion properties. A planar film induces stress, but the stress is not localized and does not generate significant quantities of defects unless the stress is very high. Sharp subsurface film corners concentrate the stress at the corners.

Increasing the radius of curvature at the corners reduces that stress. Thus, angling the mask shapes' sidewalls as shown in the figures increases the radius of curvature of the subsurface film's corners and, so, reduces stress. Thus, the mask may be formed with angled sidewalls by sputtering the mask layer and, etching of the resist layer to transfer an angle to the implant mask or, alternatively, by passivation of the shape sidewalls during to the etch, using an appropriate technique. The preferred mask sidewall angle is 30–60° and most preferably 45°.

Alternately, the implant may be angled and repeated at varying angles to the substrate, guaranteeing equivalent coverage, with a portion of the dose being implanted under the mask. The preferred implant angle is 30–60° and most preferably 45°.

Figure 8:
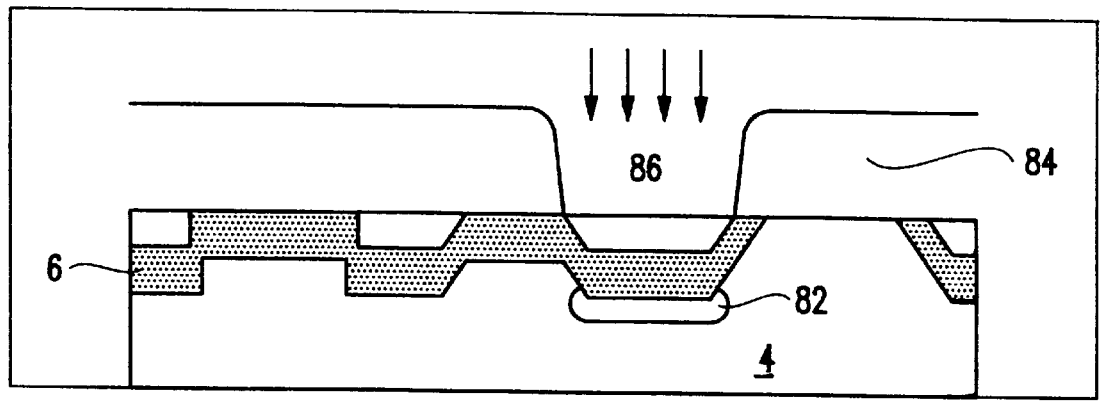
FIG. 8 is a cross section of the preferred embodiment silicon substrate of FIG. 2 showing a buried resistor formed therein.
Figure 9:
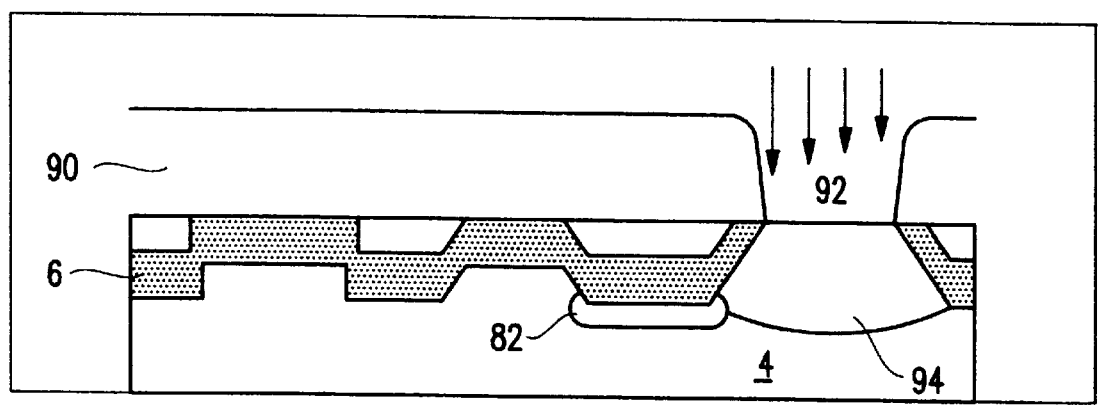
FIG. 9 is a cross section of the preferred embodiment silicon substrate of FIG. 8 with a substrate contact formed at the substrate's surface.

In FIG. 8, a buried resistor layer 82 is formed under the buried oxide layer formed in FIG. 2. After forming mask 84 on substrate 4, an appropriate dopant is implanted in opening 86. The mask 84 is stripped away and in FIG. 9 a substrate contact mask 90 is formed on the substrate 4. Then, an appropriate dopant is implanted into the substrate contact area 92 which outdiffuses to form diffusion 94. Mask 90 is then removed and processing proceeds as for any typical SOI process.

While the invention has been described in terms of a single preferred embodiment, those skilled in the art will recognize that the invention can be practiced with modification within the spirit and scope of the appended claims.

We claim:

1. A method of forming planar isolation in a semiconductor substrate comprising the steps of:

providing a substrate;

disposing a mask over said substrate, said disposing step including forming a multi-layered dielectric on said substrate, and selectively removing portions of each layer of said multi-layered dielectric; and implanting oxygen ions into said substrate through the mask, wherein the step of disposing the mask includes:

a) forming a first dielectric layer on said substrate;

b) forming a mask layer on said first dielectric layer;

c) patterning said mask layer to expose portions of said first dielectric layer; and d) removing said exposed portions of said first dielectric layer;

e) forming a second dielectric layer on remaining portions of said first dielectric layer;

f) forming a mask layer on said second dielectric layer;

g) patterning said mask layer to expose portions of said second dielectric layer; and h) removing said exposed portions of said second dielectric layer.

2. The method of claim 1 wherein in the removing step (h) a portion of said first dielectric layer is exposed.

3. The method of claim 2 wherein said first dielectric layer is an oxide layer and said second dielectric layer is a nitride layer.

4. The method of claim 1 wherein in the removing step (h) a portion of said substrate exposed in the first removing step (d) remains covered by said second dielectric layer.

5. The method of claim 4 wherein the first and second dielectric layers are layers of a same dielectric material.

6. The method of claim 5 wherein the first and second dielectric layers are oxide layers.

7. The method of claim 1 wherein the step of disposing the mask further comprises the step of:

j) repeating steps (e)–(h) until the disposed mask thickness of at least one disposed mask shape exceeds the range of travel oxygen ions being implanted in the implanting step.

8. The method of claim 1 wherein the multi-layered dielectric is alternating layers of oxide and nitride.

9. The method of claim 8 wherein the step (b) of selectively removing portions comprises the steps of:

a) forming a mask on said layered dielectric;

b) removing exposed portions of a first oxide and a first nitride layer;

c) removing said mask; and d) repeating steps a–c until portions of said substrate are exposed.

10. The method of claim 1 wherein mask shapes of said disposed mask have sidewalls at an angle to said substrate between 30–60°.

11. The method of claim 1 further comprising forming an oxide layer on said disposed mask such that mask sidewalls are at an angle to said substrate between 30–60°.

12. The method of claim 1, wherein the oxygen ions are implanted at an angle to said substrate of between 30–60°.

13. The method of claim 1, further comprising:

disposing an additional mask over the substrate which has been implanted with oxygen, said additional mask being disposed so as to leave a predetermined region of said substrate exposed; and implanting a dopant into said exposed region of said substrate to form one of a buried resistor or diffusion area.

14. A method of modulating a depth of an oxygen implant, comprising:

providing a substrate;

disposing a plurality of masks at different locations on said substrate, said masks including at least a first mask and a second mask, said first mask having a maximum thickness different from a maximum thickness of said second mask, wherein thicknesses of said first and second masks are selected to correlate with desired oxygen implant depths; and implanting oxygen into the substrate through said plurality of masks, wherein the step of disposing said plurality of masks includes disposing at least one of said first and second masks in accordance with steps that include:

a) forming a dielectric layer on said substrate;

b) forming a mask layer on said dielectric layer;

c) patterning said mask layer to expose portions of said dielectric layer;

d) removing said exposed portions of said dielectric layer; and e) repeating steps (a)–(d) at least once until a disposed mask thickness of at least one disposed mask shape is achieved.

15. The method of claim 14 wherein at least one of said first and second masks is disposed by:

a) forming a multi-layered dielectric on said substrate, a thickness of said multi-layered dielectric corresponding to at one of said desired oxygen implant depths; and b) selectively removing portions of each layer of said multi-layered dielectric.

16. The method of claim 15 wherein the multi layered dielectric is alternating layers of oxide and nitride.

17. The method of claim 16 wherein the step (b) of selectively removing portions comprises the steps of:

a) forming a mask on said layered dielectric;

b) removing exposed portions of a first oxide and a first nitride layer;

c) removing said mask; and d) repeating steps a–c until portions of said substrate are exposed.

18. The method of claim 14, wherein in repeating the removing step (d) a portion of said first dielectric layer is exposed.

19. The method of claim 18 wherein alternating layers of nitride and oxide are deposited in the step (a) of forming the dielectric layer.

20. The method of claim 14 wherein in repeating the removing step (d) a portion of said first dielectric layer remains covered with a portion of a second dielectric layer.

21. The method of claim 14 wherein an oxide layer is deposited in the step (a) of forming the dielectric layer.

22. The method of claim 14 wherein mask shapes of said disposed mask have sidewalls at an angle to said substrate between 30–60°.

23. The method of claim 21 wherein said angle to said substrate is 45°.

24. The method of claim 14 further comprising forming an oxide layer on said disposed mask such that mask sidewalls are at an angle to said substrate between 30–60°.

25. The method of claim 24 wherein said angle to said substrate is 45°.

26. The method of claim 1, wherein said mask is disposed so as to have regions of varying thicknesses, said including selecting said thicknesses to correlate with desired oxygen implant depths.

27. The method of claim 14, further comprising:

removing said plurality of masks;

disposing an additional mask over the substrate which has been implanted with oxygen, said additional mask being disposed so as to leave a predetermined region of said substrate exposed; and implanting a dopant into said exposed region of said substrate.

28. A method of modulating a depth of an oxygen implant, comprising:

providing a substrate;

disposing a plurality of masks at different locations on said substrate, said masks having varying thicknesses selected to correlate with desired oxygen implant depths;

implanting oxygen into the substrate through said plurality of masks;

removing said plurality of masks;

disposing an additional mask over the substrate which has been implanted with oxygen, said additional mask being disposed so as to leave a predetermined region of said substrate exposed; and implanting a dopant into said exposed region of said substrate, wherein said step of implanting a dopant into said exposed region of said substrate forms one of a buried resistor layer and a diffusion layer under said implanted oxygen.

29. The method of claim 14, wherein step e) includes repeating steps (a)–(d) at least once until a disposed mask thickness of at least one disposed mask shape exceeds a range of travel of oxygen ions implanted in the implanting step.

30. The method of claim 14, wherein said first mask and said second mask are disposed in non-contacting relationship.

* * * * *